(12) United States Patent
Yajima

(10) Patent No.: US 10,866,520 B2
(45) Date of Patent: Dec. 15, 2020

(54) LIGHT IRRADIATION METHOD

(71) Applicant: Ushio Denki Kabushiki Kaisha, Tokyo (JP)

(72) Inventor: Daisuke Yajima, Tokyo (JP)

(73) Assignee: USHIO DENKI KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/594,209

(22) Filed: Oct. 7, 2019

(65) Prior Publication Data

US 2020/0117098 A1    Apr. 16, 2020

(30) Foreign Application Priority Data

Oct. 10, 2018    (JP) .................................. 2018-191950

(51) Int. Cl.
*G03F 7/20*    (2006.01)

(52) U.S. Cl.
CPC ................ *G03F 7/70133* (2013.01)

(58) Field of Classification Search
CPC ............. G03F 7/70133; G03F 7/72006; G03F 7/2008; G03F 7/72022
USPC ............................................................ 355/77
See application file for complete search history.

(56) References Cited

U.S. PATENT DOCUMENTS

| 9,625,836 B2 * | 4/2017 | Yamaguchi | .......... G01B 9/0209 |
| 2002/0154589 A1 * | 10/2002 | Tanaka | ................ G11C 13/046 369/103 |

FOREIGN PATENT DOCUMENTS

JP    4514317 B2    7/2010

* cited by examiner

*Primary Examiner* — Hung Nguyen
(74) *Attorney, Agent, or Firm* — Studebaker & Brackett PC

(57) ABSTRACT

A light irradiation method includes splitting light from a coherent light source, which outputs the light at a wavelength equal to or less than 300 nm, into a plurality of branch beams. A wavefront of the light is shaped before splitting the light. The light irradiation method also includes causing the branch beams to intersect at an interference angle equal to or less than 20° to generate interfered light, and irradiating a substrate with the interfered light while continuously conveying the substrate relative to the interfered light.

5 Claims, 5 Drawing Sheets

LIGHT IRRADIATION METHOD

FIELD OF THE INVENTION

The present invention relates to a light irradiation method for providing a micropattern on a substrate, a method of manufacturing a functional device with such light irradiation method, and a light irradiation apparatus for providing the micropattern on the substrate.

DESCRIPTION OF THE RELATED ART

Conventionally known exposure techniques include contact exposure, steppers, and direct exposure. These typical exposure techniques, however, all have a small depth of focus and are limited to handle a planar workpiece.

Interference exposure, on the other hand, is known as an exposure method with a large depth of focus. For example, Japanese Patent No. 4514317 discloses a two-beam interference exposure method in which two split laser beams (branch beams) intersect at a predetermined interference angle to produce interfered light (interference fringe) and a substrate is irradiated with this interfered light. With the technique described in Japanese Patent No. 4514317, a stage is actuated stepwise, and a plurality of exposures are so made as to overlap on a workpiece (overlapped exposure) to make an exposure intensity distribution uniform in a given region of the workpiece. The scan of the interference fringe in each exposure is so controlled as to make the interference fringes overlap among the exposures.

SUMMARY OF THE INVENTION

Although the technique in Japanese Patent No. 4514317 allows for a uniform exposure of an elongated region, the technique results in an increased takt time since the workpiece is exposed, small section by small section, while being conveyed stepwise. In addition, in the two-beam interference exposure method, normally, interfered light having a pitch equivalent to that of a laser beam or a lower pitch of submicron order (sub-micrometer order) is generated, and a substrate is irradiated with this interfered light. This technique fails to consider irradiating a substrate with interfered light having a pitch of up to micron order (micrometer order), for example.

Now, a configuration of an existing exposure apparatus will be described.

FIG. 6 of the accompanying drawings illustrates a schematic configuration of an existing exposure apparatus 100. The exposure apparatus 100 illustrated in FIG. 6 splits output light from a coherent light source into two beams with a beam splitter 101, and these light beams are reflected by respective mirrors 102a and 102b. The reflected light beams are condensed by respective condenser lenses 103a and 103b, pass through pinholes 104a and 104b, are collimated by collimator lenses 105a and 105b, and are made to intersect at a predetermined interference angle θ to generate interfered light, and a workpiece W is irradiated with this interfered light.

When two split beams are made to interfere to form a stripe-pattern interference fringe, the pitch p of the interference fringe can be expressed by $\lambda/(2n \cdot \sin\theta)$. In other words, when the pitch p is to be increased, either the wavelength λ of the output light from the light source needs to be increased or the interference angle θ needs to be reduced.

To reduce the interference angle θ, an angle (2θ) formed by the two split beams needs to be reduced. However, in the existing exposure apparatus 100, spatial filters (pinhole condenser systems) are constructed directly above the workpiece W. These spatial filters are constituted by the condenser lenses (103a and 103b) and the pinholes (104a and 104b) and each have a finite size. The spatial filters are necessary for removing noise from the beam's wavefront. The absence of these spatial filters allows noise to remain in the beam's wavefront, and the noise ends up being transferred during an exposure. Therefore, a spatial filter is regarded as an essential element in two-beam interference exposure.

As illustrated in FIG. 6, two spatial filters are provided for the respective split beams.

Thus, as the interference angle θ is reduced, the two spatial filters interfere with each other, or one of the spatial filters interferes with the other split beam, as illustrated in FIG. 7. Thus, it is impossible to make the interference angle θ smaller than a certain angle (e.g., about 30°). In this manner, there is a lower limit on the interference angle θ. In the existing exposure apparatus 100, it is typical to achieve a pitch equivalent to that of a laser beam or a lower pitch, and the interference angle θ is set to no less than 30°. Specifically, a practical range of the interference angle θ is from around 30° to 60°.

As illustrated in FIG. 8 of the accompanying drawings, if the existing exposure apparatus 100 has a large distance between the spatial filters and the workpiece W, a small interference angle θ can be achieved without the spatial filters interfering with each other or without one of the spatial filters interfering with a split beam. This case, however, leads to an increase in the size of the apparatus. In addition, the extended optical path length makes the interference fringe of the interfered light unstable.

Accordingly, one object of the present invention is to provide a light irradiation method that allows for irradiation with pattern light having a desired pitch of between submicrometer order and micrometer order in a short takt time and with high accuracy without an increase in the size of the apparatus. Another object of the present invention is to provide a method of manufacturing a functional device with such light irradiation method. Still another object of the present invention is to provide a light irradiation apparatus that uses the light irradiation method to provide the micropattern on the substrate.

According to one aspect of the present invention, there is provided a light irradiation method that includes splitting light from a coherent light source, which outputs the light at a wavelength equal to or less than 300 nm, into a plurality of branch beams. A wavefront of the light is shaped before splitting the light. The light irradiation method also includes causing the branch beams to intersect at an interference angle equal to or less than 20° to generate interfered light, and irradiating a substrate with the interfered light while continuously conveying the substrate relative to the interfered light.

With this method, it is possible to generate the interfered light (interference fringe) that has a large pitch up to, for example, the micrometer order, and irradiate the substrate with such interfered light (interference fringe). Because the substrate is irradiated with the interfered light while the substrate is being continuously conveyed relative to the interfered light, it is possible to irradiate the substrate with the interfered light at high speed and in a large area. Also, it is possible to obtain a periodic light intensity distribution with no disturbance. Unlike the two-beam interference exposure method of the existing technology, it is not necessary to shape the wavefront of the light at a position immediately above the substrate because the light is split to a plurality of branch beams after the wavefront shaping, and the branch beams intersect at the interference angle to produce the interfered light. Thus, unlike the two-beam interference exposure method of the existing technology, the present invention does not suffer from the elongation of the optical path, which would otherwise be caused by reducing the interference angle. Also, a problem of size increase of the apparatus due to the reduced interference angle would not arise. Therefore, it is possible to reduce the interference angle while the reducing the optical path, and therefore the apparatus can have a small size.

According to another aspect of the present invention, there is provided a method of manufacturing a functional device. The manufacturing method includes preparing a functional device substrate having a substrate part and a functional material layer provided on a surface of the substrate part. The manufacturing method also includes splitting light from a coherent light source, which outputs the light at a wavelength equal to or less than 300 nm, into a plurality of branch beams. A wavefront of the light has been shaped before splitting. The manufacturing method also includes causing the branch beams to intersect at an interference angle equal to or less than 20° to generate interfered light. The manufacturing method also includes irradiating the functional material layer with the interfered light while continuously conveying the functional device substrate relative to the interfered light, to impart a physical property, which is derived from at least one interference fringe of the interfered light, to the functional device layer, or to form a shape, which is derived from the interference fringe(s) of the interfered light, on the functional device layer.

With this method, it is possible to generate the interfered light (interference fringe) that has a large pitch up to, for example, the micrometer order, and irradiate the functional material layer of the functional device substrate with such interfered light (interference fringe). Thus, it is possible to impart physical properties, which are derived from the interference fringe of the interfered light, to the functional material layer, or to create certain shapes in an appropriate manner. Because the functional material layer is irradiated with the interfered light while the functional device substrate is being continuously conveyed relative to the interfered light, it is possible to irradiate the functional material layer with the interfered light at high speed and in a large area. Also, it is possible to obtain a periodic light intensity distribution with no disturbance. Unlike the two-beam interference exposure method of the existing technology, it is not necessary to shape the wavefront of the light at a position immediately above the functional material layer because the light is split to a plurality of branch beams after the wavefront shaping, and the branch beams intersect at the interference angle to produce the interfered light. Thus, unlike the two-beam interference exposure method of the existing technology, the present invention does not suffer from the elongation of the optical path, which would otherwise be caused by reducing the interference angle. Also, a problem of size increase of the apparatus due to the reduced interference angle would not arise. Therefore, it is possible to reduce the interference angle while the reducing the optical path, and therefore the apparatus can have a small size.

According to still another aspect of the present invention, there is provided a method of manufacturing a functional device. The manufacturing method includes preparing a functional device substrate having a substrate part and a functional material layer provided on the substrate part. The manufacturing method also includes forming a photosensitive material layer on the functional material layer. The manufacturing method also includes splitting light from a coherent light source, which outputs the light at a wavelength equal to or less than 300 nm, into a plurality of branch beams. A wavefront of the light has been shaped before splitting. The manufacturing method also includes causing the branch beams to intersect at an interference angle equal to or less than 20° to generate interfered light. The manufacturing method also includes irradiating the photosensitive material layer with the interfered light while continuously conveying the functional device substrate relative to the interfered light, to expose the photosensitive material layer. The manufacturing method also includes removing an irradiation region or a non-irradiation region of the interfered light in the exposed photosensitive material layer, to form a shape corresponding to the interference fringe of the interfered light in the photosensitive material layer (developing step). The manufacturing method also includes removing the functional material layer through etching in accordance with the shape of the developed photosensitive material layer to form a microperiodic structure on the substrate part.

With this method, it is possible to generate the interfered light (interference fringe) that has a large pitch up to, for example, the micrometer order, and irradiate the photosensitive material layer on the functional device substrate with such interfered light (interference fringe) to expose the photosensitive material layer. By undergoing the developing process and the etching process, it is possible to form a microperiodic structure, which has the pitch in the micrometer order, on the substrate. Because the photosensitive material layer is irradiated with the interfered light while the functional device substrate is being continuously conveyed relative to the interfered light, it is possible to irradiate the photosensitive material layer with the interfered light at high speed and in a large area. Also, it is possible to obtain a periodic exposure light intensity distribution with no disturbance. Unlike the two-beam interference exposure method of the existing technology, it is not necessary to shape the wavefront of the light at a position immediately above the functional device substrate because the light is split to a plurality of branch beams after the wavefront shaping, and the branch beams intersect at the interference angle to produce the interfered light. Thus, unlike the two-beam interference exposure method of the existing technology, the present invention does not suffer from the elongation of the optical path, which would otherwise be caused by reducing the interference angle. Also, a problem of size increase of the apparatus due to the reduced interference angle would not arise. Therefore, it is possible to reduce the interference angle while the reducing the optical path, and therefore the apparatus can have a small size.

The manufacturing method may also include shaping the wavefront of the light with a spatial filter before splitting the light. If the spatial filter is used to shape the wavefront of the light, it is possible to appropriately remove noise from the wavefront of the light in a relatively easy manner.

The step of splitting light from a coherent light source may include splitting the light into a plurality of branch beams after shaping the wavefront of the light with the spatial filter. The step of causing the branch beams to intersect may include causing the branch beams to intersect at the interference angle equal to or less than 20° by using a mirror device combination. If the branch beams are caused to intersect at a desired angle by the mirror device combination, the manufacturing method can enjoy a certain degree of freedom in selecting the interference angle. For example, it is possible to reduce the interference angle to several degrees.

The microperiodic structure may have a plurality of linear portions extending in parallel to each other, and a pitch between each two adjacent linear portions may be equal to or greater than 0.5 µm. Then, it is possible to for the microperiodic structure to have a pitch greater than the wavelength of the light emitted from the light source.

The pitch may be equal to or greater than 1 µm. Then, it is possible to for the microperiodic structure to have a pitch in the micrometer order.

According to yet another aspect of the present invention, there is provided a light irradiation apparatus that includes a coherent light source configured to output light at a wavelength equal to or less than 300 nm. The light irradiation apparatus also includes an interference optical system configured to shape a wavefront of the light, which is output from the coherent light source, split the light into a plurality of branch beams, and cause the branch beams to intersect at an interference angle equal to or less than 20° to generate interfered light. The light irradiation apparatus also includes a stage on which a substrate is placed, and configured to convey the substrate relative to the interfered light. The light irradiation apparatus also includes a control unit configured to control the coherent light source and the stage such that the substrate is irradiated with the interfered light while continuously conveying the substrate relative to the interfered light.

With this method, it is possible to generate the interfered light (interference fringe) that has a large pitch up to, for example, the micrometer order, and irradiate the substrate with such interfered light (interference fringe). Because the substrate is irradiated with the interfered light while the substrate is being continuously conveyed relative to the interfered light, it is possible to irradiate the substrate with the interfered light at high speed and in a large area. Also, it is possible to obtain a periodic light intensity distribution with no disturbance. Unlike an existing apparatus that utilizes the two-beam interference exposure method, it is not necessary to dispose a spatial filter at a position immediately above the substrate to perform the wavefront shaping because the light is split to a plurality of branch beams after the wavefront shaping, and the branch beams intersect at the interference angle to produce the interfered light.

Thus, unlike the two-beam interference exposure apparatus of the existing technology, the present invention does not suffer from the elongation of the optical path, which would otherwise be caused by reducing the interference angle. Also, a problem of size increase of the apparatus due to the reduced interference angle would not arise. Therefore, it is possible to reduce the interference angle while the reducing the optical path, and therefore the apparatus can have a small size.

The interference optical system may include a beam-shaping device having a spatial filter for shaping the wavefront of the light from the light source. The interference optical system may also include a beam-splitting device for splitting the light, which has been shaped by the beam-shaping device, into a plurality of branch beams. The interference optical system may also include a mirror device for deflecting the branch beams toward the substrate to cause the branch beams to intersect at the interference angle.

By disposing the beam-shaping device upstream of the beam-splitting device, instead of disposing the beam-shaping device immediately above the substrate, it is possible to reduce the interference angle to, for example, several degrees while reducing the optical path. Thus, the apparatus can have a small size.

The mirror device may have an angle-variable mirror that can adjust the interference angle. The angle-variable mirror can adjust the interference angle to a desired value. Thus, it is possible to change the pitch of the interfered light, and use the light irradiation apparatus in a variety of purposes.

The interference optical system may include a Mach-Zehnder interferometer, a Michelson's interferometer, a Twyman-Green interferometer, or a Fizeau interferometer. By using one of these interferometers, it is possible for the interfered light to have a desired pitch in a relatively easy manner.

According to another aspect of the present invention, there is provided a functional device that is manufactured by one of the above-described manufacturing method. With one of the above-described manufacturing method, the functional device can have a highly precise pattern with a desired pitch in sub-micrometer order to micrometer order.

The present invention does not enlarge the apparatus size, but is still able to generate a pattern of light having a desired pitch between a sub-micrometer order and a micrometer order and precisely direct such pattern of light to a target in a short takt time.

DETAILED DESCRIPTION OF EMBODIMENTS

Embodiments of the present invention will now be described in detail below.

First Embodiment

Figure 1:
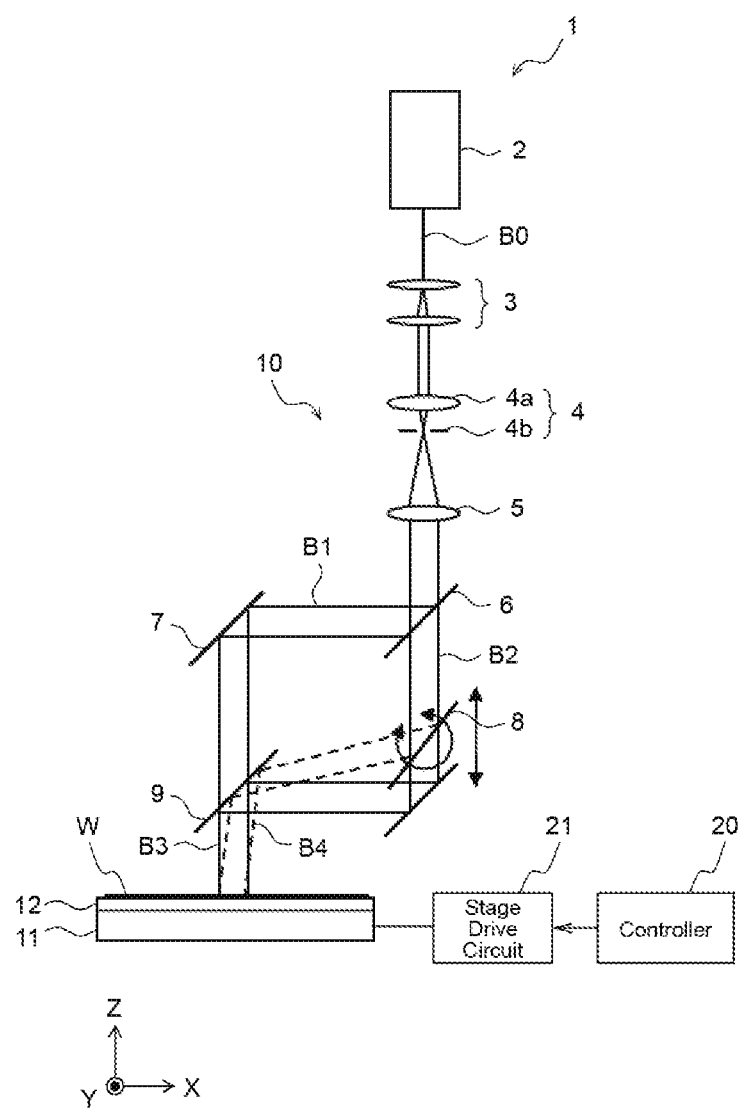
FIG. 1 illustrates a schematic configuration of a light irradiation apparatus (exposure apparatus) according to a first embodiment of the present invention

FIG. 1 illustrates a schematic configuration of a light irradiation apparatus (exposure apparatus) 1 according to a first embodiment of the present invention.

The exposure apparatus 1 includes a light source 2 and an interference optical system 10. The light source 2 is a coherent light source that outputs a light beam at a wavelength of no more than 300 nm (equal to or less than 300 nm). The interference optical system 10 splits the output light from the light source 2 into two or more beams and makes the split output light beams intersect at an interference angle of no more than 20° to generate interfered light.

The exposure apparatus 1 further includes a stage 11, a suction board 12, a controller (control unit) 20, and a stage drive circuit (actuating circuit) 21. A workpiece W to be irradiated with the interfered light is placed on the stage 11, and the stage 11 conveys the workpiece W relative to the interfered light. The controller 20 controls the light source 2 and the stage 11 to cause the workpiece W to be irradiated with the interfered light while the workpiece W is being conveyed continuously relative to the interfered light.

The interference optical system 10 includes a beamshaping (beamforming) device, a beam-splitting device, and a mirror device. The beamforming device includes a spatial filter 4 for shaping the wavefront of the output light from the light source 2. The beam-splitting device splits the output light shaped by the beamforming device into two or more beams. The mirror device deflects the light beams split by the beam-splitting device toward a substrate to make the split light beams intersect at an interference angle of no more than 20°.

Specifically, as illustrated in FIG. 1, the interference optical system 10 includes a beam expander 3, the spatial filter 4, a collimator lens 5, a beam-splitting element 6, a stationary mirror 7, a variable mirror 8, and a half-silvered mirror 9. The spatial filter 4 includes a condenser lens 4a and a pinhole 4b. In FIG. 1, the beam expander 3, the spatial filter 4, and the collimator lens 5 correspond to the beamforming device. The beam-splitting element 6 corresponds to the beam-splitting device, and the stationary mirror 7, the variable mirror 8, and the half-silvered mirror 9 correspond to the mirror device.

In this embodiment, the interference optical system 10 employs a configuration of a Mach-Zehnder interferometer.

In other words, in the exposure apparatus 1, the spatial filter 4 is disposed in a stage preceding the beam-splitting element 6, the output light from the light source 2 has its wavefront shaped by the spatial filter 4 and is then split into two or more beams by the beam-splitting element 6, and the split output light beams are made to intersect at an interference angle of no more than 20° via a mirror device combination to generate the interfered light.

In this manner, the exposure apparatus 1 of this embodiment includes the spatial filter 4 provided upstream of the beam-splitting element 6, and no spatial filter is provided directly above the workpiece W.

A spatial filter is necessary for removing noise from a beam's wavefront and is constituted by a condenser lens and a pinhole. When such a spatial filter is not provided directly above a workpiece W, noise remains in the beam's wavefront, and the noise ends up being transferred during an exposure. Therefore, a spatial filter is regarded as an essential element in two-beam interference exposure.

In this embodiment, no spatial filter is provided directly above the workpiece W, and thus an exposure pattern may be disturbed due to an influence of wavefront noise or the like.

Figure 2:
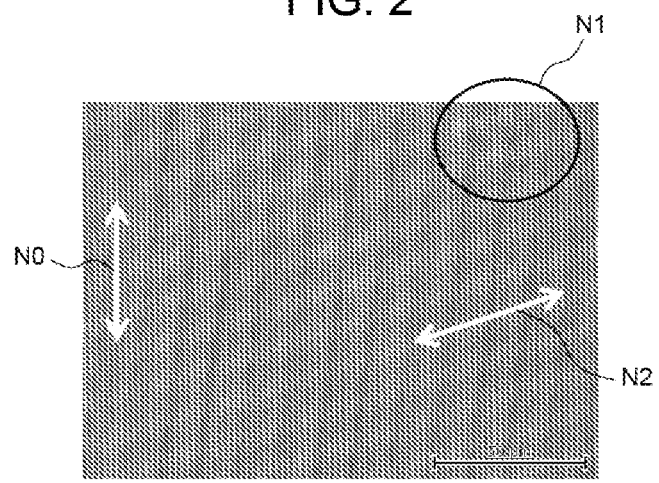
FIG. 2 illustrates an example of interfered light with which a workpiece is irradiated.

FIG. 2 illustrates an example of the interfered light with which the workpiece W is irradiated. When no spatial filter is provided directly above the workpiece W, as illustrated in FIG. 2, an interference fringe N1 disturbed due to an influence of wavefront noise caused by a stain on a mirror or the like and/or an unwanted interference fringe N2 may be produced in addition to a desired interference fringe N0 with no disturbance. Such disturbance in the interference fringe results in a defect or a variation in a linear portion (or linear portions) of a microperiodic structure.

To avoid this, the exposure apparatus 1 of this embodiment irradiates the workpiece W with the interfered light while the workpiece W is being conveyed continuously relative to the interfered light. With this configuration, a periodic exposure intensity distribution with no disturbance can be obtained on the workpiece W even when no spatial filter is provided directly above the workpiece W. Thus, a defect or a variation in the linear portions of a microperiodic structure can be suppressed. An exposure method carried out by the exposure apparatus 1 will be described later in detail.

Now, a configuration of each unit included in the exposure apparatus 1 will be described in detail.

The light source 2 is a coherent light source that emits coherent light at a wavelength of no more than 300 nm and can be, for example, a semiconductor excitation solid-state laser that emits a laser beam at a wavelength λ of 266 nm. A laser beam B0 emitted by the light source 2 has its beam diameter expanded by the beam expander 3, is subjected to wavefront shaping where any disturbance in the beam wavefront is removed by the spatial filter 4, and is then collimated by the collimator lens 5.

The beam-splitting element 6 splits the single laser beam into two laser beams B1 and B2. The beam-splitting element 6 can be, for example, a half-silvered mirror. The two laser beams B1 and B2 generated by the beam-splitting element 6 are redirected, respectively, by the stationary mirror 7 and the variable mirror 8 and then become incident on the half-silvered mirror 9.

The laser beam redirected by the stationary mirror 7 and incident on the half-silvered mirror 9 passes through the half-silvered mirror 9 to result in a laser beam B3. The laser beam redirected by the variable mirror 8 and incident on the half-silvered mirror 9 is reflected by the half-silvered mirror 9 to result in a laser beam B4. Then, these two laser beams B3 and B4 intersect at a predetermined intersecting angle (2θ). Thus, an interference fringe is generated on the workpiece (substrate) W by the interference of the two laser beams B3 and B4. The exposure apparatus 1 irradiates a light-irradiating surface of the workpiece W with this interfered light serving as exposure light. In other words, the exposure apparatus 1 transfers a stripe-pattern line-and-space interference fringe onto the workpiece W in a single exposure.

The pitch p between adjacent lines in the interference fringe is variable with the intersecting angle 2θ, which is the angle formed by two beams. Specifically, the pitch p is dependent on the interference angle θ, the wavelength λ, of the output light from the light source 2, and the refractive index n of the exposure environment. A relational expression of $p=\lambda/(2n \cdot \sin\theta)$ holds. In the case of an exposure in the air, the refractive index n is 1.

In this embodiment, the wavelength λ of the light source 2 is set to no more than 300 nm, and the interference angle θ is set to no more than 20° (0<θ≤20°). Then, the exposure apparatus 1 forms a stripe-pattern interference fringe having a pitch p of no less than 0.5 μm or preferably no less than 1 μm. The variable mirror 8 can be a variable-angle mirror of which the angle of the light-incident surface can be adjusted, and the interference angle θ can be adjusted as the angle of the light-incident surface of the variable mirror 8 is adjusted.

The workpiece W can be secured to the suction board 12 provided on the stage 11. The workpiece W can be, for example, a substrate having a photosensitive material layer (e.g., photoresist or the like) formed on a functional device substrate in which a functional material layer is provided on a surface of a substrate. Alternatively, the workpiece W may be a substrate having a photosensitive material layer formed on its surface.

For example, in the case of a positive resist where an irradiated portion of the resist serving as a photosensitive material layer applied on a substrate dissolves in a developer, a resist pattern in which an unirradiated portion remains can be obtained by exposing and developing the resist with the interfered light. In the case of a negative resist where an irradiated portion of the resist is so linked as not to dissolve in a developer, a resist pattern in which the irradiated portion remains after developing can be obtained by exposing and developing the resist with the interfered light.

The stage 11 has a degree of freedom that allows the stage 11 to move in X- and Y-directions relative to the surface of the workpiece W, and the controller 20 can cause the stage 11 to move in the X- and Y-directions by controlling actuation of the stage actuating circuit 21. In other words, the workpiece W moves in the X- and Y-directions as the stage 11 is moved in the X- and Y-directions. Here, the X-direction is the right-left direction of FIG. 1, and the Y-direction is the vertical direction to the sheet of FIG. 1.

Although not illustrated, a shutter may be disposed between the light source 2 and the beam expander 3, for example. This shutter may switch ON and OFF of laser beam emission. The opening and closing of the shutter may be controlled by the controller 20.

In addition to the angle of the light-incident surface, an attachment position of the variable mirror 8 may be variable. Changing at least one of the angle and the attachment position of the variable mirror 8 allows the interference angle $\theta$ to be adjusted to a desired angle, and the pitch of the interference fringe can be adjusted.

In the exposure apparatus 1, a portion of the beam that has passed through the half-silvered mirror 9 or that has been split by the half-silvered mirror 9 does not enter the workpiece W, and thus a damper for receiving this beam may be provided.

In the exposure apparatus 1 of this embodiment, a mask for shaping the beam may be disposed directly above the workpiece W. The mask can be constituted by a shading member (shielding member) having a rectangular aperture portion (light-transmitting portion), for example. The light-transmitting portion can have any desired shape. The mask can be disposed with a predetermined gap provided between the mask and the workpiece W. In this case, a gap sensor may be embedded in the stage 11 and the suction board 12, and the distance between the suction board 12 and the mask may be measured with the gap sensor. This mask may be disposed directly on the workpiece W with no gap provided therebetween. Alternatively, the workpiece W may be irradiated directly with the beam without shaping the beam with the mask.

Now, an exposure method for the exposure apparatus 1 will be described.

In this embodiment, the exposure apparatus 1 performs a scan exposure of continuously conveying a substrate relative to the interfered light in a first direction parallel to the interference fringe. In a second direction substantially orthogonal to the first direction, the exposure apparatus 1 makes irradiation regions of the interfered light partially overlap such that the periods of the interference fringes match in a plurality of exposures.

In this embodiment, the first direction is the Y-direction, and the second direction is the X-direction.

In the exposure process of performing an exposure in the first direction, the controller 20 irradiates a workpiece W while continuously moving the stage 11. In other words, the controller 20 moves the stage 11 with the shutter controlled to remain open.

Figure 3:
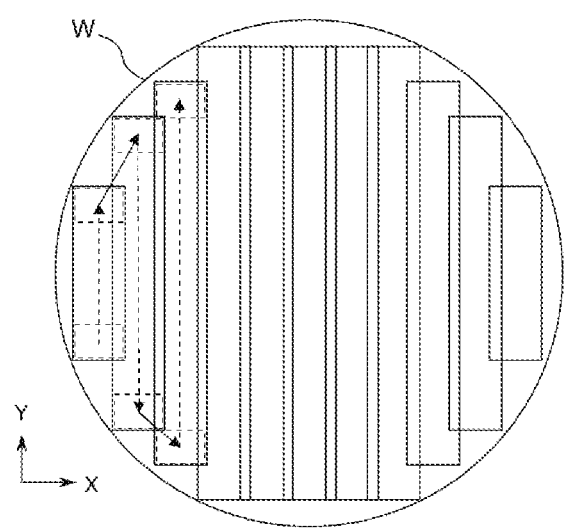
FIG. 3 is a view useful to describe a method of exposing the workpiece.

For example, as illustrated in FIG. 3, an exposure starts at a lower left position of the workpiece W. Firstly, the workpiece W is conveyed in the −Y-direction (downward direction in FIG. 3), and a first row of the workpiece W is exposed while the irradiation region of the interfered light is being moved relative to the workpiece W. In other words, the exposure region is moved continuously in the +Y-direction (upward direction in FIG. 3) from the lower left position of the workpiece W, and the workpiece W is exposed up to its upper left position.

FIG. 3 illustrates an example in which the irradiation region of the interfered light is formed into a rectangular shape with a mask.

After having exposed the first row of the workpiece W, the controller 20 temporarily closes the shutter, conveys the workpiece W in the −X-direction (left direction in FIG. 3) and the −Y-direction, and positions the irradiation region of the interfered light to an upper end of a second row. Then, the controller 20 opens the shutter, conveys the workpiece W in the +Y-direction (upward direction of FIG. 3), and exposes the second row while moving the irradiation region of the interfered light relative to the workpiece W. In other words, for the second row, the workpiece W is exposed while the exposure region is being moved continuously in the −Y-direction (downward direction of FIG. 3) from the upper end position. When exposing each row in the X-direction, the irradiation regions of the interfered light are made to overlap such that the periods (pitches) of the interference fringes overlap.

The above-described operation is repeated on the workpiece W from its left end to its right end in the X-direction, and the entire workpiece W is exposed. This allows for a continuous seamless exposure on the entire surface of the workpiece W, and the entire workpiece W can be exposed with high accuracy.

In this manner, when a functional device having a microperiodic structure on a substrate is manufactured, firstly, a functional device substrate having a substrate part and a functional material layer provided on the substrate part is prepared, and a photosensitive material layer is formed on the functional material layer. Then, output light from a coherent light source that outputs light at a wavelength of no more than 300 nm is split into two or more beams, and the split output light beams are made to intersect at an interference angle $\theta$ of no more than 20° to generate interfered light. In the process of generating the interfered light, the output light having its wavefront shaped by a spatial filter is split into two or more beams, and the split output light beams are made to intersect at an interference angle $\theta$ of no more than 20° via a mirror device combination.

Then, the photosensitive material layer is irradiated with the interfered light while the functional device substrate is being conveyed continuously relative to the interfered light to expose the photosensitive material layer. The irradiation region or the non-irradiation region of the interfered light in the exposed photosensitive material layer is removed, and a shape corresponding to the interference fringe of the interfered light is formed in the photosensitive material layer. Then, the functional material layer is removed through etching in accordance with the shape of the developed photosensitive material layer to form a microperiodic structure on the substrate.

The microperiodic structure formed at this point has a number of linear portions that extend parallel to each other. The pitch p between adjacent linear portions is determined by the wavelength $\lambda$ of the output light from the light source and the interference angle $\theta$. For example, when a light source that emits light at a wavelength $\lambda$ of 266 nm is used and the interference angle $\theta$ is no more than 15° ($\theta \leq 15°$), the pitch p of no less than 514 nm (p≥514 nm) is obtained. Thus, the pitch p of no less than 0.5 µm (p≥0.5 µm) can be achieved. In addition, for example, when a light source that emits light at a wavelength λ of 266 nm is used and the interference angle θ is no more than 7° (θ≤7°), the pitch p of no less than 1091 nm (p≥1091 nm) is obtained. In this manner, the pitch p of no less than 1 µm (p≥1 µm) can be achieved.

As described, the exposure apparatus 1 splits the light having a wavelength of no more than 300 nm into two or more beams after having shaped the wavefront of the light and performs interference exposure with the use of the interfered light generated by making the two or more beams intersect as an interference angle θ of no more than 20°. Accordingly, the exposure apparatus 1 can achieve, as a pitch of the interfered light, a pitch in sub-micrometer order to micrometer order and can easily manufacture a microperiodic structure having a pitch between adjacent linear portions of no less than 0.5 µm or preferably no less than 1 µm.

In this embodiment, the spatial filter 4 is not disposed directly above the workpiece W but disposed in a stage preceding the beam-splitting element 6, and the light beams having subjected to wavefront shaping are made to intersect at a small interference angle θ (0≤20°) on the workpiece W to generate the interfered light. Specifically, a configuration of a Mach-Zehnder interference system is used as the interference optical system 10 that splits coherent light into two or more beams after having shaped its wavefront and generates an interference fringe at a predetermined interference angle θ to generate the interfered light. This can eliminate the lower limit value of the interference angle θ, and the interference angle θ can be made much smaller than the existing technology (existing two-beam interference exposure method).

With the existing two-beam interference exposure method, two spatial filters are used, i.e., a spatial filter is disposed in each intersecting optical path directly above a workpiece. Therefore, as the interference angle θ is reduced, the two spatial filters physically interfere with each other, or one of the spatial filters interferes with the other split beam, which renders it impossible to make the interference angle θ smaller than a certain angle. In this manner, the existing two-beam interference exposure method has a lower limit value (around 30°) of the interference angle θ due to an arrangement constraint of the spatial filters.

In contrast, in this embodiment, the spatial filter 4 is not disposed directly above the workpiece W but disposed in a stage preceding (upstream of) the beam-splitting element 6. Since only one spatial filter 4 is disposed in an optical path where the beam has not been split, even when the interference angle θ is reduced, unlike the existing two-beam interference exposure method, physical interference of spatial filters does not occur. Therefore, this embodiment can eliminate the lower limit value of the interference angle θ, which has been impossible with the existing two-beam interference exposure method, and the interference angle θ can be made much smaller. For example, the interference angle θ can be set to less than 15° with ease. Accordingly, even when a light source that emits light at a wavelength λ of no more than 300 nm is used as a coherent light source, an interference fringe having a pitch of no less than 0.5 µm or even a pitch in micrometer order can be formed with ease.

Now, the significance of a feature where the wavelength λ of the light source is less than 300 nm will be described.

For example, if a light source that emits a laser beam at a wavelength λ of 532 nm is used, a pitch of no less than 0.5 µm can be achieved even with an interference angle θ of 30°. However, when a target workpiece is a photosensitive material, such as a photoresist, a laser in an ultraviolet band needs to be used as a light source since a resin material of a photoresist is generally highly absorptive of an ultraviolet wavelength range. Therefore, the wavelength λ of between about 200 nm and about 400 nm is employed. In this manner, there is an upper limit on the wavelength λ.

In other words, the pitch of an interference fringe that can be created through existing two-beam interference exposure is generally less than 0.5 µm due to the presence of the lower limit value of the interference angle θ and the upper limit value of the wavelength λ.

In this embodiment, as described above, the lower limit value of the interference angle θ can be eliminated, and the interference angle θ can be reduced even to several degrees, for example. Therefore, even if there is an upper limit value of the wavelength λ, an interference fringe having a pitch of no less than 0.5 µm or even a pitch in micrometer order can be formed with ease. In other words, even when the target workpiece is a photosensitive material, such as a photoresist, and the wavelength λ of the output light from the light source is restricted to between about 200 nm and about 400 nm, an interference fringe having a pitch of no less than 0.5 µm or even a pitch in micrometer order can be formed with ease.

Furthermore, with the existing two-beam interference exposure method, the only measure that can be taken to reduce the interference angle θ without the above-described interference is to secure an extended distance between the spatial filters and the workpiece W. This, however, leads to an increase in the size of the apparatus. In addition, the increase in the optical path length also poses a problem in that the interference fringe of the interfered light becomes unstable.

In contrast, unlike the existing two-beam interference exposure method, the physical interference of the spatial filters does not occur in this embodiment, and thus there is no need to increase the optical path length to avoid such interference. In other words, the interference angle θ can be reduced with the optical path length kept short. Accordingly, the size of the apparatus can be reduced.

As described above, the exposure apparatus 1 of this embodiment performs an exposure with a scan exposure method. Therefore, a periodic exposure intensity distribution with no disturbance can be obtained on a workpiece W even when no spatial filter is provided directly above the workpiece W, and a defect or a variation in a linear portion of a microperiodic structure can be suppressed or eliminated. In addition, as the exposure apparatus 1 utilizes the scan exposure method, the exposure apparatus 1 can expose a large surface area quickly. In this manner, the exposure apparatus 1 can perform a seamless exposure of a substrate with a large surface area quickly with high accuracy.

In this manner, in this embodiment, the interfered light is generated through the interference optical system 10 that employs a configuration of a Mach-Zehnder interferometer, for example. Thus, the interference angle θ can be reduced with neither interference of spatial filters as in the existing two-beam interference exposure method nor an increase in the optical path length for preventing such interference. Accordingly, an interference fringe having a desired pitch in sub-micrometer order to micrometer order can be achieved with ease. In addition, in this embodiment, a high-precision stage is combined with the interference optical system 10, and a scan exposure is performed in which a workpiece is irradiated with the interfered light while the stage is being moved continuously in the direction identical to the direction of the interference fringe. Therefore, even when no spatial filter is disposed directly above the workpiece W as in the interference optical system 10 of this embodiment, a periodic exposure intensity distribution with no disturbance can be obtained on the workpiece W, and the quality of the exposure pattern can be improved.

As described above, in this embodiment, as a pitch of the interfered light, a pitch in sub-micrometer order to micrometer order can be achieved with a single optical system with ease. In addition, a large surface area can be irradiated seamlessly with a pattern light having a pitch in the above-mentioned order in a short takt time independent of the flatness of the workpiece.

The light irradiation method of this embodiment can be applied to a method of manufacturing, for example but not limited to, a diffraction grating, a photomask, a nanoimprint mold, a patterned sapphire substrate for an LED.

Second Embodiment

Now, a second embodiment of the present invention will be described. Similar or same reference numerals and symbols are used in the first and second embodiments to designate similar or same elements and things.

The first embodiment deals with an example in which the substrate (workpiece) is irradiated with the interference fringe having a stripe pattern. The second embodiment deals with an example in which the workpiece is irradiated with the interference fringe having a lattice pattern (grating pattern).

Similar to the first embodiment, the exposure apparatus 1 of the second embodiment performs a scan exposure in the first direction (the extending direction of the interference fringe) and an overlap exposure in the second direction (the direction generally perpendicular to the extending direction of the interference fringe). In the second embodiment, the exposure is performed a plurality of times (twice) to the workpiece W. In the first exposure, the entire workpiece W is irradiated with the interference fringe that has the stripe shape in the Y-direction (similar to the first embodiment). In the second exposure, the entire workpiece W is irradiated with a different interference fringe that is prepared by rotating the interference fringe of the first exposure by a predetermined angle. This will be described with reference to FIG. 4 and FIG. 5.

Figure 4:
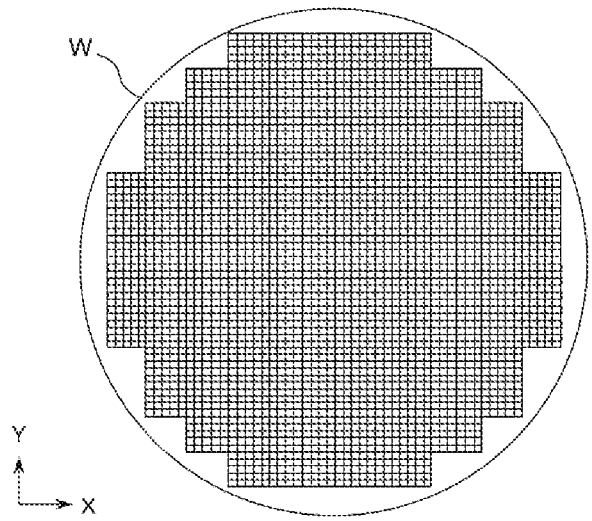
FIG. 4 shows a dot patterning when a photo-alignment angle is 90 degrees.

When a photo-alignment angle is set to 90°, as shown in FIG. 4, a lattice pattern can be formed on the entire surface of the workpiece W. For example, if the photosensitive material layer (e.g., resist) applied on the substrate is a positive resist and an irradiated portion of the positive resist dissolves in a developer, then the above-described exposure method is used for exposure and dissolves the irradiated portion that has a lattice shape. As a result, a resist pattern, which has fine square poles or fine round poles (circular columns) remained, is obtained. The fine square poles or fine round poles are arranged in a square pattern, i.e., a square pattern of fine poles or dots is obtained. On the other hand, the photosensitive material layer applied on the substrate is a negative resist and an irradiated portion of the negative resist is so linked as not to dissolve in a developer, then the above-described exposure method causes the irradiated portion of the negative resist, which has a lattice shape, to remain upon developing. As a result, a pattern, which has square holes (recesses) or round holes (circular recesses), is formed.

Figure 5:
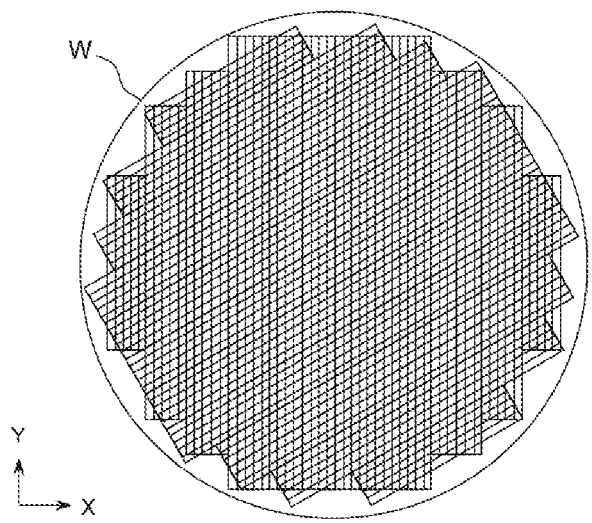
FIG. 5 shows a dot patterning when a photo-alignment angle is 120 degrees.
Figure 6:
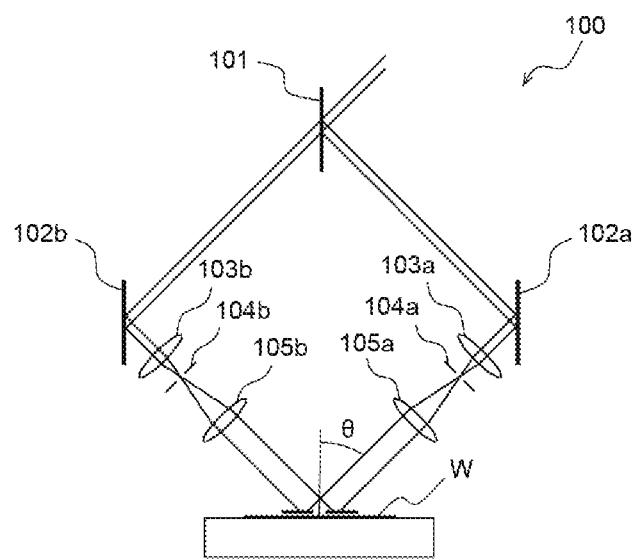
FIG. 6 illustrates an existing exposure apparatus.
Figure 7:
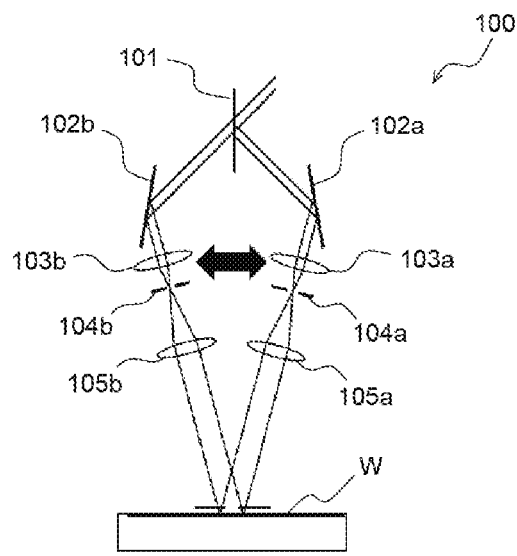
FIG. 7 illustrates the existing exposure apparatus of FIG. 6 when an interference angle is changed.
Figure 8:
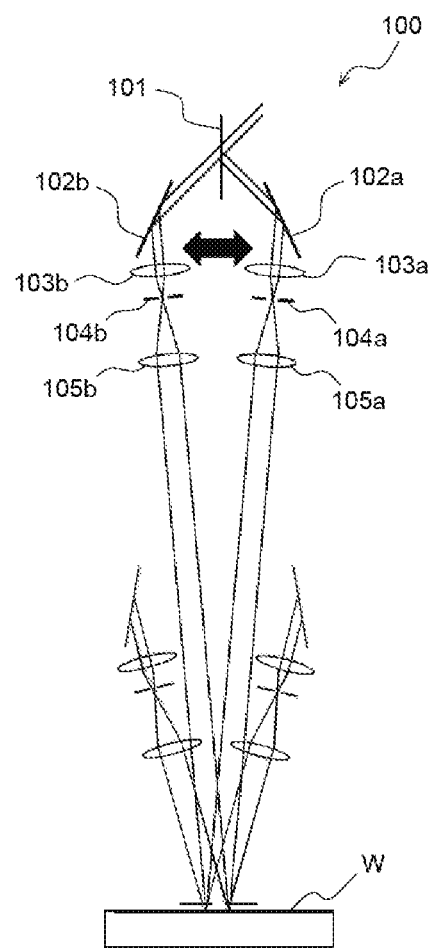
FIG. 8 illustrates the existing exposure apparatus of FIG. 6 when the interference angle is reduced near to a lower limit.

It should be noted that the photo-alignment angle δ is not limited to 90°, but may have an arbitrary value between 0° and 180° (0°<δ<180°). By selecting the photo-alignment angle in this range, it is possible to change the shape of the interference fringe applied to the workpiece W. For example, the photo-alignment angle may be 120°. If the photo-alignment angle is 120°, the longitudinal direction of the interference fringe of the first exposure crosses the longitudinal direction of the interference fringe of the second exposure at 120°, as shown in FIG. 5, and the resulting dot pattern has a plurality of generally oval shapes in the X-Y plane. The oval dots are arranged in a triangle pattern.

It should be noted that when the second exposure (or a subsequent exposure following the second exposure) is carried out, the interference fringe may be rotated (turned) or the stage 11, on which the workpiece W is laid, is rotated. Preferably, the stage 11 is rotated because it is easier in carrying out the interference exposure a plurality of times.

As described above, the exposure is applied to the workpiece W twice in the second embodiment, and it is possible to manufacture a pattern of seamless dots or seamless holes (a seamless dot pattern or a seamless hole pattern).

The light irradiation method of this embodiment can be applied to a method of manufacturing, for example but not limited to, a microlens array.

Modifications

In each of the first and second embodiments, the interference optical system 10 of the exposure apparatus 1 employs a configuration of a Mach-Zehnder interferometer. It should be noted, however, that the interference optical system 10 is not limited to the Mach-Zehnder interferometer. An arbitrary interference optical system 10 may be used as long as the interference optical system 10 can split the output light from the light source 2, which has its wavefront shaped by the spatial filter, into two or more beams (branch beams), and cause the split output light beams to intersect at an interference angle of no more than 20° via a mirror device combination. In other words, it is satisfactory as long as the spatial filter is located upstream of the beam-splitting device. For example, a Michelson's interferometer, a Twyman-Green interferometer, or a Fizeau interferometer may be used.

In each of the first and second embodiments, the interference exposure process, the developing process and the etching process are carried out to provide a microperiodic structure on the substrate. It should be noted that the workpiece W is not limited to a substrate having a photosensitive material layer formed on the surface of the substrate. For example, the substrate may be a functional device substrate that has a functional material layer formed on a surface of the substrate. Then, the functional material layer is irradiated with the interference fringe to impart the physical properties, which are derived from the interference fringe of the interfered light, to the functional material layer, or to create certain shapes. In this case, a periodic structure that has a similar refractive index to a FBG (Fiber Bragg Grating) may be manufactured. Alternatively, laser ablation that is caused by a high-output pulse laser may be utilized to directly create certain shapes, which conform to the interference fringe, on the functional material layer, or photo-setting (photo-curing) resin is exposed and cured to provide a fine structure that has a shape corresponding to the interference fringe.

In each of the first and second embodiments, the two-beam interference exposure is described. It should be noted that the light from the light source may be split into three beams or more and these split beams (branch beams) are simultaneously applied to the substrate. This is so-called multi-beam interference exposure. The beam-splitting device may be a diffraction optical element that splits the laser light into a plurality of beams. If the optical parts are arranged to split the laser light into four beams such that four planes defined by the four beams and the normal line to the substrate are arranged at 90° intervals and each two confronting beams intersect on the substrate at a predetermined interference angle, then the same result is obtained as in the case where the interference fringe made by the two beams is used twice in an overlapping manner by rotating (turning) the same interference fringe 90°.

In each of the first and second embodiments, the exposure apparatus performs the scan exposure in the first direction and an overlap exposure in the second direction (the direction generally perpendicular to the interference fringe). It should be noted that another exposure other than the overlap exposure may be carried out in the second direction. For example, a plate having a rectangular aperture may be prepared and a center portion of the laser light may be directed to the workpiece W. Then, a step-and-repeat exposure method may be used to form a plurality of linear patterns (rectangular patterns) without gaps. However, the overlap exposure is preferred because the overlap exposure can provide seamless exposure.

While certain embodiments have been described, these embodiments have been presented by way of example only, and are not intended to limit the scope of the present invention. The devices and methods described herein may be embodied in a variety of other forms. Furthermore, various omissions, substitutions, modifications and changes may be made to the devices and methods described herein, without departing from the gist of the present invention. The accompanying claims and their equivalents are intended to cover such forms or modifications as would fall within the scope and gist of the present invention.

The present application is based upon and claims the benefit of a priority from Japanese Patent Application No. 2018-191950, filed on Oct. 10, 2018, and the entire contents of which are incorporated herein by reference.

What is claimed is:

1. A method of manufacturing a functional device, comprising:
    preparing a functional device substrate having a substrate part and a functional material layer provided on the substrate part;
    forming a photosensitive material layer on the functional material layer;
    splitting light from a coherent light source, which outputs the light at a wavelength equal to or less than 300 nm, into a plurality of branch beams, a wavefront of the light being shaped before said splitting;
    causing the plurality of branch beams to intersect at an interference angle equal to or less than 20° to generate interfered light;
    irradiating the photosensitive material layer with the interfered light while continuously conveying the functional device substrate relative to the interfered light, to expose the photosensitive material layer;
    removing an irradiation region or a non-irradiation region of the interfered light in the exposed photosensitive material layer, to form a shape corresponding to the interference fringe of the interfered light in the photosensitive material layer; and
    removing the functional material layer through etching in accordance with the shape formed in the photosensitive material layer to form a microperiodic structure on the substrate part.

2. The method of manufacturing a functional device according to claim 1, further including shaping the wavefront of the light with a spatial filter before said splitting.

3. The method of manufacturing a functional device according to claim 2, wherein said splitting light from a coherent light source includes splitting the light into the plurality of branch beams after shaping the wavefront of the light with the spatial filter, and
    said causing the plurality of branch beams to intersect includes causing the plurality of branch beams to intersect at the interference angle equal to or less than 20° by using a mirror device combination.

4. The method of manufacturing a functional device according to claim 1, wherein the microperiodic structure has a plurality of linear portions extending in parallel to each other, and a pitch between each two adjacent linear portions is equal to or greater than 0.5 μm.

5. The method of manufacturing a functional device according to claim 4, wherein the pitch is equal to or greater than 1 μm.

* * * * *